(12) United States Patent
Nishibayashi

(10) Patent No.: US 6,294,411 B1
(45) Date of Patent: Sep. 25, 2001

(54) METHOD FOR MOLDING A SEMICONDUCTOR DEVICE UTILIZING A SATIN FINISH

(75) Inventor: Akihito Nishibayashi, Chiba (JP)

(73) Assignee: Nippon Steel Semiconductor Corporation, Tateyama (JP)

( * ) Notice: Subject to any disclaimer, the term of this patent is extended or adjusted under 35 U.S.C. 154(b) by 0 days.

(21) Appl. No.: 09/247,555

(22) Filed: Feb. 10, 1999

Related U.S. Application Data

(62) Division of application No. 08/957,457, filed on Oct. 24, 1997, now abandoned.

(30) Foreign Application Priority Data

Oct. 25, 1996 (JP) .................................................. 8-299819

(51) Int. Cl.⁷ .................................................. H01L 21/48
(52) U.S. Cl. .......................... 438/127; 438/124; 438/126; 29/827; 29/855
(58) Field of Search .................................. 438/123, 124, 438/126, 127, 112, 367, 371, 379, 384, 106, 125, 121; 257/787, 797, 668; 29/827, 855, 856

(56) References Cited

U.S. PATENT DOCUMENTS

| 4,857,483 | * | 8/1989 | Steffen et al. ........................ | 438/112 |
| 5,817,208 | * | 10/1998 | Nose et al. ........................... | 156/500 |

FOREIGN PATENT DOCUMENTS

| 55-21126 | 2/1980 | (JP) . |
| 55-41755 | 3/1980 | (JP) . |
| 60-98649 | 6/1985 | (JP) . |
| 62-150855 | 7/1987 | (JP) . |
| JP63260181 | 4/1990 | (JP) . |
| 2-107201 | * 4/1990 | (JP) . |
| JP01012638 | 7/1990 | (JP) . |
| 2-192742 | * 7/1990 | (JP) . |
| 3-157957 | 7/1991 | (JP) . |

* cited by examiner

Primary Examiner—Olik Chaudhuri
Assistant Examiner—Alonzo Chambliss
(74) Attorney, Agent, or Firm—Connolly Bove Lodge & Hutz

(57) ABSTRACT

A semiconductor component includes, before molding, a lead frame, a semiconductor chip mounted on the lead frame, and bonding wires for connecting pads of the semiconductor chip to inner leads. This component is inserted between a lower mold and an upper mold having a mold cavity moving unit, and these molds are clamped. Thereafter, an inner space formed by these clamped molds is filled with resin to form a package. Particularly, before resin filling, the mold cavity moving unit is moved downward and presses upper portions of the bonding wires to regulate the wire height. In this state, the inner space of these molds is filled with the resin. Before the filling resin is cured, the mold cavity moving unit is returned to the upper surface position of the package to form a nonfilling space in these molds. Thereafter, the nonfilling space is filled with the resin. With these processes, before resin filling, the bonding wires are pressed by the mold cavity moving unit to regulate the wire height, thus preventing the bonding wires from being exposed to the package surface after molding.

9 Claims, 5 Drawing Sheets

METHOD FOR MOLDING A SEMICONDUCTOR DEVICE UTILIZING A SATIN FINISH

This is a divisional application of Ser. No. 08/957,457 filed on Oct. 24, 1997, now abandoned.

BACKGROUND OF THE INVENTION

1. Field of the Invention

The present invention relates to a semiconductor device for preventing wire deformation in molding and exposure of bonding wires to a surface of the package, a method of manufacturing the same, and molds for the method.

2. Background of the Invention

Conventionally, a lead frame and a chip are normally set at the center of the package in a TSOP (Thin Small Outline Package) having an LOC (Lead On Chip) structure including bus bars. For this reason, a surface of the lead frame shifts from the center of the package to the upper side, so the distance from the surface of the lead frame to a surface of the package becomes short. To prevent bonding wires from being exposed to the surface of the package, in wire bonding, restriction on loops, and accuracy and stability of the height of the wires are required. To meet this requirement, wire bonding is performed by appropriately selecting the apparatus, capillary, wire material, and the like.

In addition, since the bonding wires must be bridged low, the interval between the bus bar and the wire decreases. In this case, even when slight wire deformation happens in molding, the wires touch the bus bars. Therefore, transfer conditions are selected to prevent wire deformation.

In the above-mentioned related art, however, the bonding wires may be exposed to the surface of the package. Additionally, since wire deformation readily happens, the wires may touch the bus bars.

SUMMARY OF THE INVENTION

It is an object of the present invention to provide a semiconductor device capable of preventing wire deformation and exposure of bonding wires to a surface of the package, a method of manufacturing the same, and molds for the method.

According to an aspect of the present invention, there is provided a semiconductor device comprising a semiconductor chip, a lead for inputting/outputting an electrical signal to/from the semiconductor chip, a bonding wire for electrically connecting the lead to the semiconductor chip, and a resin for encapsulating the bonding wire, the lead, and the semiconductor chip while partially exposing the lead to an outside of the resin, wherein the resin encapsulates the bonding wire without exposing the bonding wire to the outside of the resin and has a surface contacting the outside, and the surface of the resin has a mark of one of recessed and projecting shapes at the closest portion to the bonding wire.

Preferably, the mark is formed by a resin encapsulating mold.

According to another aspect of the present invention, there is provided a method of manufacturing a resin-encapsulated semiconductor device whose package is formed by covering a semiconductor chip with a resin, comprising the first step of connecting a pad of the semiconductor chip mounted on a lead frame to an inner lead of the lead frame by a bonding wire, the second step of, using molds constituted by an upper mold having a mold cavity moving unit which can move upward/downward and a lower mold integrated with the upper mold to form an inner space, setting a portion including the semiconductor chip and the bonding wire in the inner space of the molds. The third step moves the mold cavity moving unit downward to press an upper portion of the bonding wire and filling the inner space of the molds with the resin while regulating the wire height, and the fourth step of returns the mold cavity moving unit to a surface position of the package and fills a nonfilling space formed by returning the mold cavity moving unit with the resin.

Preferably, in the fourth step, the nonfilling space is filled with the resin before the resin in the molds is cured.

Preferably, the inner space is filled with the resin by the mold cavity moving unit.

According to still another aspect of the present invention, there is provided molds for manufacturing a semiconductor device whose package is formed by covering a semiconductor chip with a resin, comprising an upper mold having a mold cavity moving unit which can move upward/downward, and a lower mold integrated with the upper mold to form an inner space.

Preferably, an anti-slip process is performed on at least a surface of the mold cavity moving unit which contacts a bonding wire connected to the semiconductor chip.

Preferably, the anti-slip process is a satin process.

Preferably, the inner space is filled with the resin by the mold cavity moving unit.

According to the present invention, before resin filling, the bonding wires are pressed by the mold cavity moving unit to regulate the height of the bonding wires, thus preventing the bonding wires from being exposed to the surface of the package after molding. As a result, the loop shape of the bonding wire is corrected and fraction defects can be lowered.

Furthermore, according to the present invention, when the mold cavity moving unit moves downward to bring its lower portion into contact with the upper ends of the bonding wires, frictional force increases between the bonding wire and the mold cavity moving unit by the anti-slip portion, thus preventing slip. This prevents the bonding wires from moving in the horizontal direction, what is called wire deformation. As a result, since the height of the bonding wires is properly regulated, the loop shape of the bonding wire is corrected and fraction defects can be lowered.

Furthermore, according to the present invention, the finely processed satin surface properly comes in contact with the bonding wires to prevent slip between the bonding wire and the mold cavity moving unit, thus effectively preventing wire deformation. As a result, since the height of the bonding wires is properly regulated, the loop shape of the bonding wire is corrected and fraction defects can be lowered. Since wire deformation need not be taken into consideration, transfer speed of resin and throughput of the apparatus can be increased.

DETAILED DESCRIPTION OF THE PREFERRED EMBODIMENT

Figure 1:
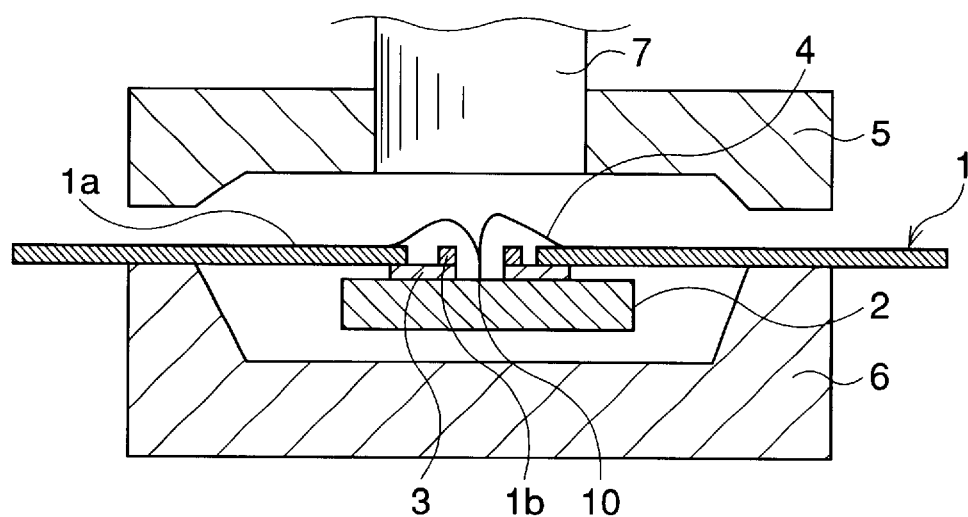
FIG. 1 is a schematic sectional view showing a method of manufacturing a resin-encapsulated semiconductor device according to an embodiment of the present invention.

A method of manufacturing a resin-encapsulated semiconductor device according to the present invention will be described below in detail with reference to the accompanying drawings. FIGS. 1 to 5 are schematic sectional views showing a manufacturing process of the semiconductor device in order. Note that FIGS. 1 to 5 show only a molding process, i.e., a molding method of transferring resin (filling with resin) using molds.

In this process, first, a semiconductor chip (device) 2 is mounted on a lead frame 1 with a polyimide tape 3 interposed therebetween. Thereafter, pads 10 of the semiconductor chip 2 are connected to inner leads 1a of the lead frame 1 by bonding wires 4. Reference numeral 1b denotes a bus bar.

Next, molding as the main process of this embodiment is performed. The semi-finished product formed in the above manner is loaded into a space between an upper mold 5 and a lower mold 6 while the semiconductor chip 2 is directed downward, and positioned. The lead frame 1 is mounted on the upper surface of the lower mold 6. The upper mold 5 has a mold cavity moving unit 7 which can move upward/downward in the upper mold 5 and transfer resin. The mold cavity moving unit 7 is set at a position where it can come in contact with the bonding wires 4, and the lower surface of the mold cavity moving unit 7 is set to be flush with an inner surface of the upper mold 5.

The upper mold 5 is moved downward from the state shown in FIG. 1 such that the lead frame 1 is sandwiched between the upper mold 5 and the lower mold 6 and fixed. When the mold cavity moving unit 7 is moved downward, the manufacturing apparatus is set in the state shown in FIG. 2.

As the mold cavity moving unit 7 moves downward, the lower surface of the mold cavity moving unit 7 presses the tops of the bonding wires 4 down, thereby decreasing the height of the bonding wires 4. With this operation, the bonding wires 4 are prevented from being exposed to a surface of the package.

Figure 2:
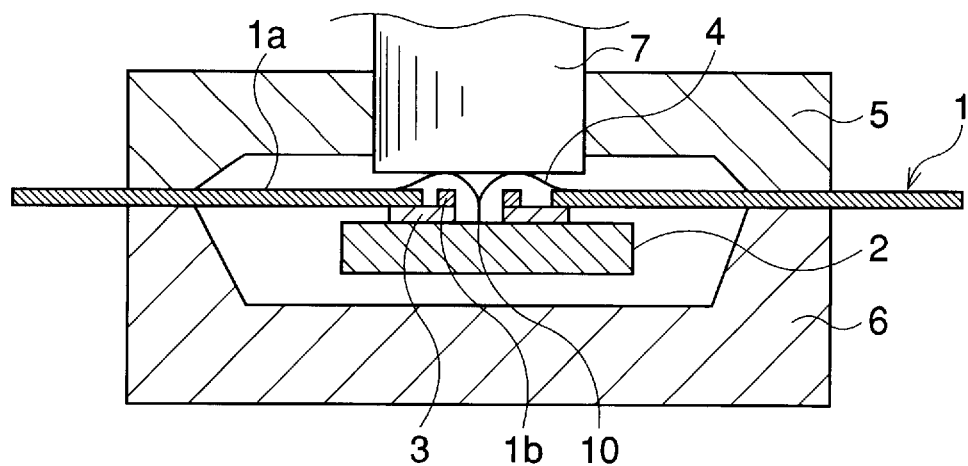
FIG. 2 is a schematic sectional view showing the method of manufacturing the resin-encapsulated semiconductor device according to the embodiment of the present invention following FIG. 1.
Figure 3:
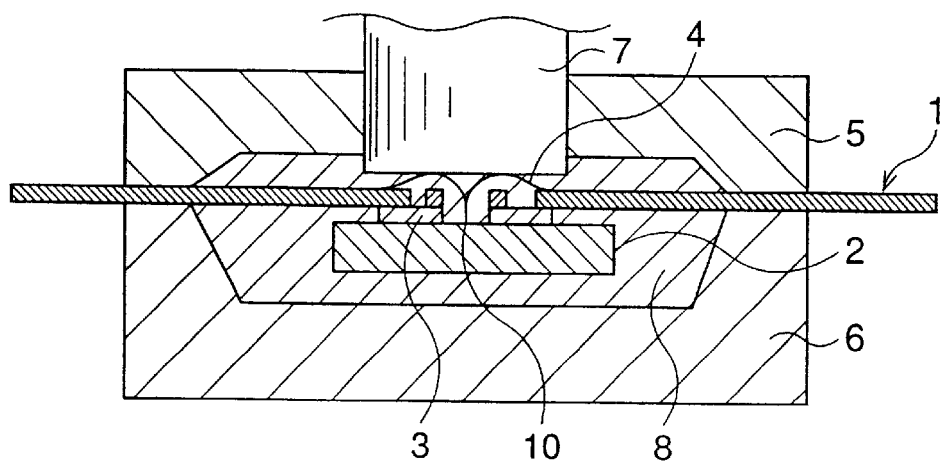
FIG. 3 is a schematic sectional view showing the method of manufacturing the resin-encapsulated semiconductor device according to the embodiment of the present invention following FIG. 2.
Figure 4:
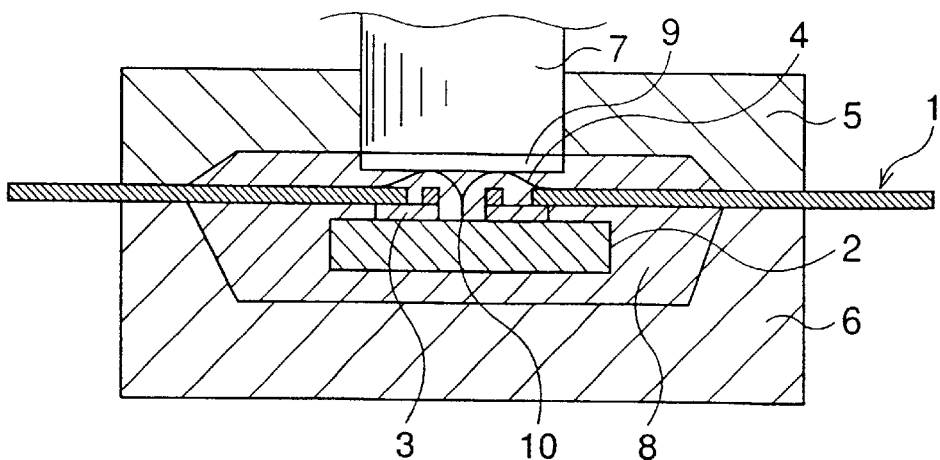
FIG. 4 is a schematic sectional view showing the method of manufacturing the resin-encapsulated semiconductor device according to the embodiment of the present invention following FIG. 3.
Figure 5:
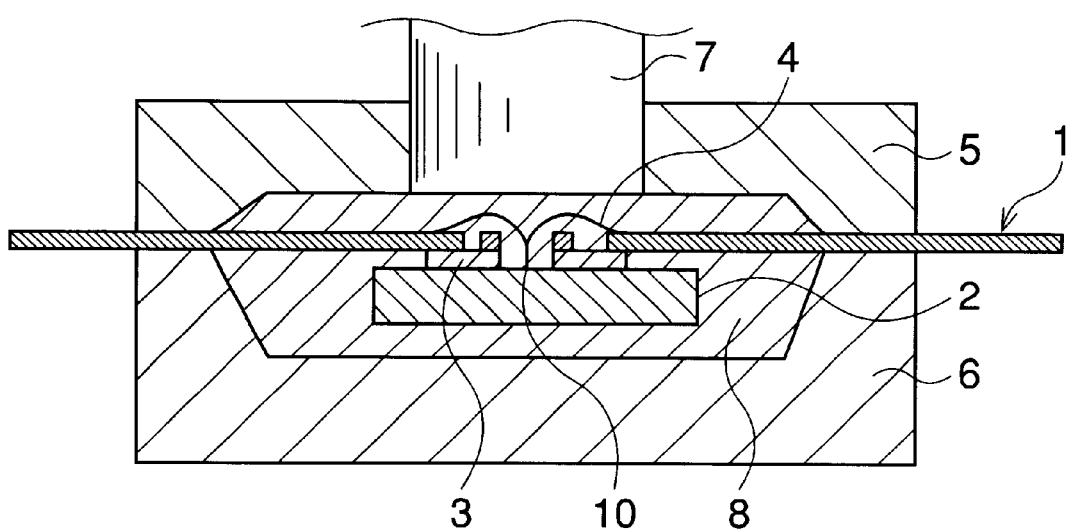
FIG. 5 is a schematic sectional view showing the method of manufacturing the resin-encapsulated semiconductor device according to the embodiment of the present invention following FIG. 4.

As shown in FIG. 3, while the mold cavity moving unit 7 is kept in the state shown in FIG. 2, a resin 8 is transfered into the entire space in the molds through the mold cavity moving unit 7. Thereafter, the mold cavity moving unit 7 is slightly pulled up to make its lower surface flush with the inner surface of the upper mold 5, as shown in FIG. 4. At this time, a nonfilling space 9 without the resin 8 is formed under the mold cavity moving unit 7. Again, the resin is transfered into the nonfilling space 9 through the mold cavity moving unit 7, thereby planarizing the upper surface of the package of the semiconductor device as a product, as shown in FIG. 5. When the mold cavity moving unit 7 is pulled up, negative pressure arises in the nonfilling space 9. Therefore, no void is generated when the resin is transfered into the nonfilling space 9. However, a mark may be left by the difference between the level of the lower surface of the mold cavity moving unit 7 and the level of the inner surface of the upper mold 5. When this mark is positively left and discriminated by the shape of the mold cavity moving unit 7, this mark can be used as a trademark or product identification mark.

A satin process can be performed on a portion of the mold cavity moving unit 7 which can come in contact with the bonding wires 4. With this process, in resin filling, the bonding wires 4 can be prevented from slipping by the friction between the bonding wire and the mold cavity moving unit 7, thus preventing wire deformation. Therefore, the height of the bonding wires 4 can be properly regulated. Instead of the satin process, a process for giving a similar effect may be performed. For example, notches or fine slits may be formed on the lower surface of the mold cavity moving unit 7. That is, the mold cavity moving unit 7 can have any structure for preventing slip of the bonding wires.

Figure 6A:
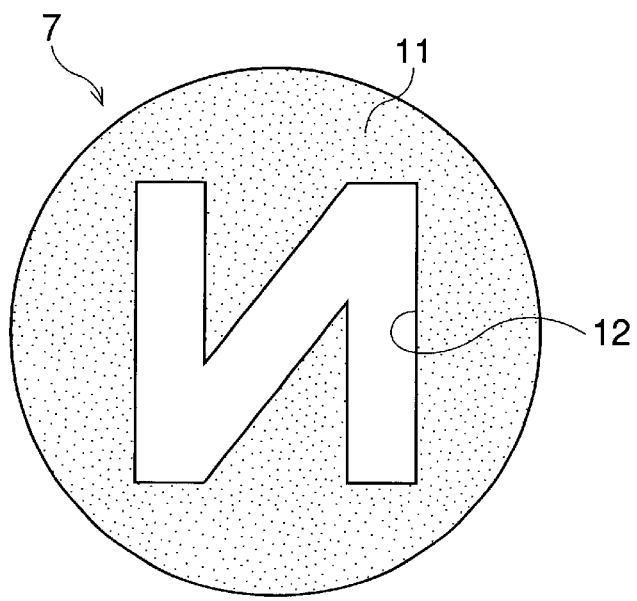
FIGS. 6A and 6B are schematic plan views respectively showing an example of a mold cavity moving unit and a mark formed on a surface of a package by the mold cavity moving unit.
Figure 6B:
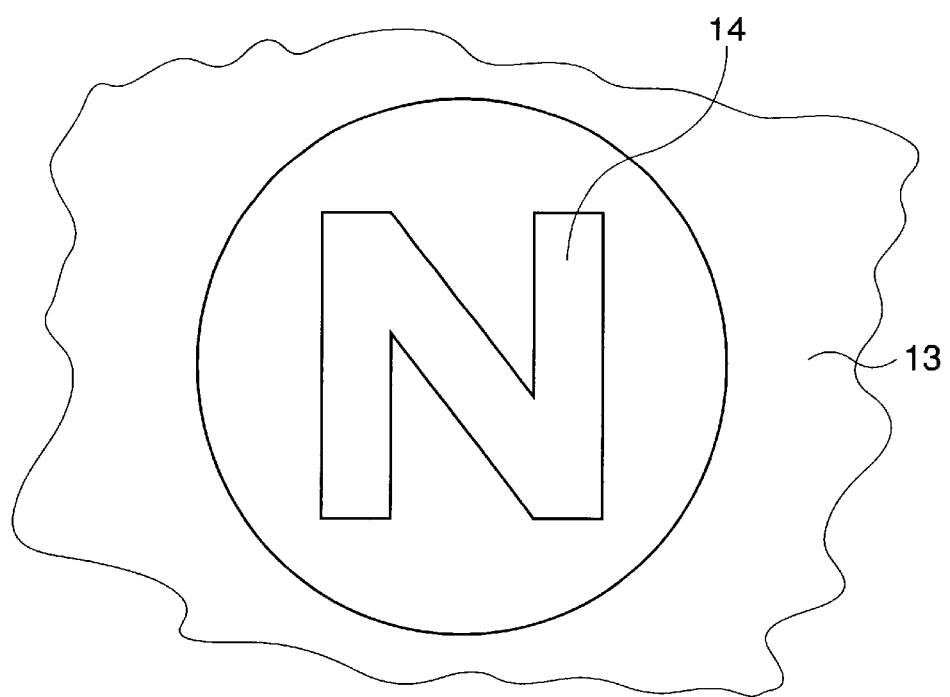

FIGS. 6A and 6B show a specific example in which the satin process is performed on a press surface of the mold cavity moving unit 7, and an N-shaped mark is formed. In this case, as shown in FIG. 6A, the satin process is performed on the press surface 11 of the mold cavity moving unit 7, and an N-shaped transfer port 12 for transfering the resin 8 is formed in the press surface 11. When the above-mentioned molding is performed using this mold cavity moving unit 7, as shown in FIG. 6B, an N-shaped mark 14 in a circle is formed on a package surface 13 conforming to the pattern of the press surface 11.

Figure 7A:
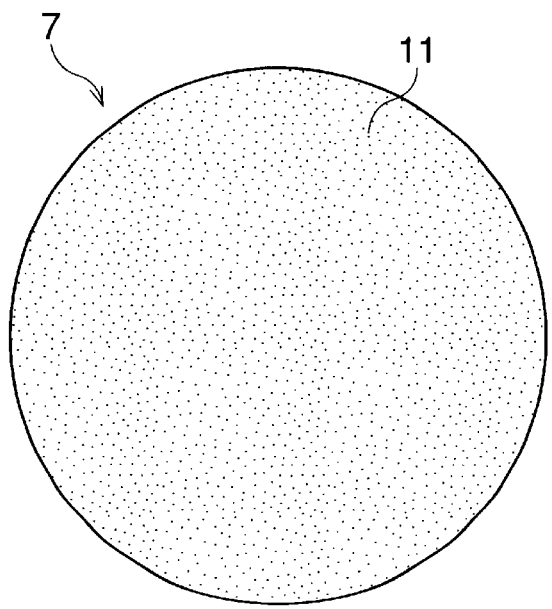
FIGS. 7A and 7B are schematic plan views respectively showing another example of a mold cavity moving unit and a mark formed on a surface of a package by the mold cavity moving unit.
Figure 7B:
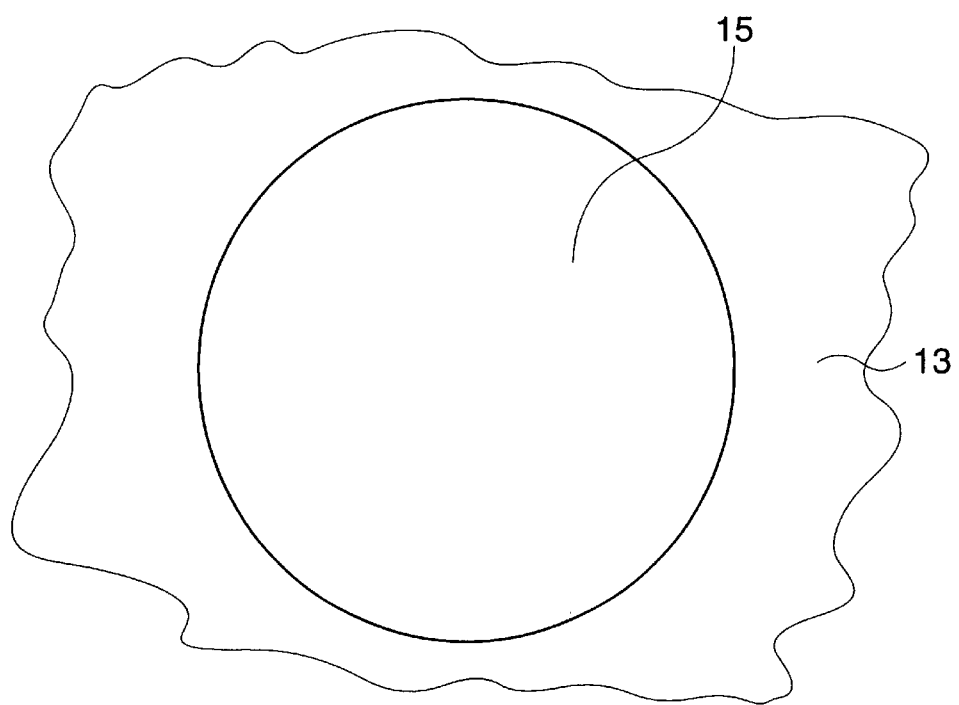

In this embodiment, the transfer port for transfering the resin 8 is formed in the mold cavity moving unit 7. However, the present invention is not limited in this case. The transfer port for transfering the resin 8 may be formed at a predetermined portion of the molds other than the mold cavity moving unit 7. FIGS. 7A and 7B show a specific example in which the satin process is performed on a press surface of the mold cavity moving unit 7, and a circular product identification mark is formed. In this case, as shown in FIG. 7A, the satin process is performed on the entire press surface 11 of the mold cavity moving unit 7. When the above-mentioned molding is performed using this mold cavity moving unit 7, as shown in FIG. 7B, a circular mark 15 is formed on the package surface 13 conforming to the pattern of the press surface 11.

As has been described above, according to this embodiment, before resin filling, the bonding wires 4 are pressed by the mold cavity moving unit 7 to regulate the height of the bonding wires 4, thus preventing the bonding wires 4 from being exposed to the surface of the package after molding. As a result, the loop shape of the bonding wire 4 is corrected and fraction defects can be lowered.

What is claimed is:

1. A method of manufacturing a resin-encapsulated semiconductor device whose package is formed by covering a semiconductor chip with a resin, comprising:

the first step of connecting a pad of said semiconductor chip mounted on a lead frame to an inner lead of said lead frame by a bonding wire;

the second step of, using molds constituted by an upper mold having a mold cavity moving unit which can move upward/downward and a lower mold integrated with said upper mold to form an inner space, setting a portion of said semiconductor device including said semiconductor chip and said bonding wire in the inner space of said molds;

the third step of moving said mold cavity moving unit downward to press an upper portion of said bonding wire, through direct contact such that said mold cavity moving unit regulates the height and movement of said bonding wire while said resin is inserted into the inner space of said molds, and then filling the inner space of said molds with said resin; and the fourth step, performed after completing said third step, of returning said mold cavity moving unit to a surface position of said package and then filling a nonfilling space, formed by returning said mold cavity moving unit, with said resin.

2. The method according to claim 1, wherein, in the fourth step, the nonfilling space is filled with said resin before said resin in said molds is cured.

3. The method according to claim 1, wherein the inner space is filled with said resin by said mold cavity moving unit.

4. Molds for manufacturing a semiconductor device whose package is formed by covering a semiconductor chip with a resin, comprising:

a lower mold;

an upper mold integrated with said lower mold to form an inner space; and a mold cavity moving unit connected to said upper mold that can move within said inner space along an axis that is perpendicular to a surface of said semiconductor chip, during a process of encapsulating said semiconductor chip with said resin;

wherein an anti-slip process is performed on at least a surface of said mold cavity moving unit that directly contacts a bonding wire connected to said semiconductor chip such that said mold cavity moving unit regulates the height and movement of said bonding wire while said resin is inserted into the inner space of said molds.

5. The molds according to claim 4, wherein the anti-slip process is a satin process.

6. The molds according to claim 4, wherein the inner space is filled with said resin by said mold cavity moving unit.

7. Molds for resin encapsulating a semiconductor chip, which is mounted on a lead frame and has a bonding wire connecting a connecting pad with an inner lead of said lead frame, comprising:

a lower mold;

an upper mold integrated with said lower mold to form an inner space;

a mold cavity moving unit attached to said upper mold that can move within said inner space along an axis that is perpendicular to a surface of said semiconductor chip, during a process of encapsulating said semiconductor chip with said resin;

said mold cavity moving unit moving toward said semiconductor chip to press an upper portion of a bonding wire in the inner space of said molds, through direct contact such that the mold cavity moving unit regulates the height and movement of said bonding wire by a resin is inserted into the inner space formed by said molds; and said mold cavity moving unit returning to a surface position of said package so that the void within the inner surface, resulting from the re-positioning of said mold cavity moving unit, with said resin.

8. The molds according to claim 7, further comprising:

wherein said resin is injected by said mold cavity moving unit.

9. The molds according to claim 7, wherein:

said mold cavity moving unit has an anti-slip surface formed from a satin-process that makes contact with said bonding wire.

* * * * *